(12) United States Patent
Yuan et al.

(10) Patent No.: US 7,999,332 B2
(45) Date of Patent: Aug. 16, 2011

(54) ASYMMETRIC SEMICONDUCTOR DEVICES AND METHOD OF FABRICATING

(75) Inventors: Jun Yuan, Hopewell Junction, NY (US); Dureseti Chidambarrao, Hopewell Junction, NY (US); Sunfei Fang, Hopewell Junction, NY (US); Yue Liang, Hopewell Junction, NY (US); Haizhou Yin, Hopewell Junction, NY (US); Xiaojun Yu, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 244 days.

(21) Appl. No.: 12/465,818

(22) Filed: May 14, 2009

(65) Prior Publication Data

US 2010/0289085 A1 Nov. 18, 2010

(51) Int. Cl.
*H01L 21/70* (2006.01)
(52) U.S. Cl. ......... 257/407; 257/412; 257/369; 257/900
(58) Field of Classification Search .................. 257/407, 257/412, 369, 900; 438/286
See application file for complete search history.

(56) References Cited

U.S. PATENT DOCUMENTS

| | | | |
|---|---|---|---|
| 5,763,311 A | 6/1998 | Gardner et al. | |
| 5,789,298 A | 8/1998 | Gardner et al. | |
| 5,841,168 A | 11/1998 | Gardner et al. | |
| 5,963,809 A | 10/1999 | Duane et al. | |
| 6,008,094 A | 12/1999 | Krivokapic et al. | |
| 6,127,235 A | 10/2000 | Gardner et al. | |
| 6,153,905 A | 11/2000 | Davies et al. | |
| 6,180,502 B1 | 1/2001 | Liang | |
| 6,187,675 B1 | 2/2001 | Buynoski | |
| 6,503,786 B2 | 1/2003 | Klodzinski | |
| 6,605,845 B1 | 8/2003 | Liang | |
| 6,630,720 B1 | 10/2003 | Maszara et al. | |
| 6,664,594 B2 | 12/2003 | Klodzinski | |
| 6,686,245 B1 | 2/2004 | Mathew et al. | |
| 6,800,905 B2 | 10/2004 | Fried et al. | |
| 6,831,310 B1 | 12/2004 | Mathew et al. | |
| 6,903,967 B2 | 6/2005 | Mathew et al. | |
| 6,921,700 B2 | 7/2005 | Orlowski et al. | |
| 6,967,143 B2 | 11/2005 | Mathew et al. | |
| 6,974,729 B2 | 12/2005 | Collaert et al. | |
| 7,018,876 B2 | 3/2006 | Mathew et al. | |
| 7,064,019 B2 | 6/2006 | Fried et al. | |
| 7,098,502 B2 | 8/2006 | Mathew et al. | |
| 7,112,832 B2 | 9/2006 | Orlowski et al. | |
| 7,120,046 B1 | 10/2006 | Forbes | |
| 7,144,782 B1 | 12/2006 | Ehrichs | |

(Continued)

*Primary Examiner* — Mark Prenty
(74) *Attorney, Agent, or Firm* — Scully, Scott, Murphy & Presser, P.C.; H. Daniel Schnurmann (57) ABSTRACT

A semiconductor structure is provided that includes an asymmetric gate stack located on a surface of high k gate dielectric. The asymmetric gate stack includes a first portion and a second portion, wherein the first portion has a different threshold voltage than the second portion. The first portion of the inventive asymmetric gate stack includes, from bottom to top, a threshold voltage adjusting material and at least a first conductive spacer, while the second portion of the inventive asymmetric gate stack includes at least a second conductive spacer over the gate dielectric. In some embodiments, the second conductive spacer is in direct contact with the underlying high k gate dielectric, while in other embodiments, in which the first and second conductive spacers are comprised of different conductive materials, the base of the second conductive spacer is in direct contact with the threshold adjusting material.

18 Claims, 5 Drawing Sheets

U.S. PATENT DOCUMENTS

| | | |
|---|---|---|
| 7,183,164 B2 | 2/2007 | Haller |
| 7,192,876 B2 | 3/2007 | Mathew et al. |
| 7,199,419 B2 | 4/2007 | Haller |
| 7,202,517 B2 | 4/2007 | Dixit et al. |
| 7,229,895 B2 | 6/2007 | Wells |
| 7,247,570 B2 | 7/2007 | Thomas |
| 7,285,812 B2 | 10/2007 | Tang et al. |
| 7,288,445 B2 | 10/2007 | Bryant et al. |
| 7,326,611 B2 | 2/2008 | Forbes |
| 7,354,831 B2 | 4/2008 | Orlowski |
| 7,368,344 B2 | 5/2008 | Haller |
| 7,368,365 B2 | 5/2008 | Wells |
| 7,371,627 B1 | 5/2008 | Forbes |
| 7,372,092 B2 | 5/2008 | Manning et al. |
| 2002/0020873 A1 | 2/2002 | Klodzinski |
| 2003/0034522 A1 | 2/2003 | Klodzinski |
| 2008/0057635 A1 | 3/2008 | Chen |
| 2009/0294873 A1* | 12/2009 | Zhu et al. .............. 257/401 |

* cited by examiner

ASYMMETRIC SEMICONDUCTOR DEVICES AND METHOD OF FABRICATING

FIELD OF THE INVENTION

The present invention relates to semiconductor devices and a method of fabricating the same. More particularly, the present invention relates to asymmetric semiconductor devices and a method in which a spacer scheme is employed in fabricating the same.

BACKGROUND OF THE INVENTION

One trend in modern integrated circuit manufacture is to produce semiconductor devices, such as field effect transistors (FETs), which are as small as possible. In a typical FET, a source and a drain are formed in an active region of a semiconductor substrate by implanting n-type or p-type impurities in the semiconductor material. Disposed between the source and the drain is a channel (or body) region. Disposed above the body region is a gate electrode. The gate electrode and the body are spaced apart by a gate dielectric layer.

Although the fabrication of smaller transistors allows more transistors to be placed on a single substrate for the formation of relatively large circuit systems in a relatively small die area, this downscaling can result in a number of performance degrading effects. In addition, achieving a desired device dimension is often difficult as device designers are constrained by limitations imposed by various manufacturing techniques. For example, photolithography is often used to pattern a mask layer that is used to determine the size and placement of device components, such as the gate. However, lithographic limits restrict gate formation to a certain minimum length.

Asymmetric FET devices provide some benefits over conventional FET devices including, for example, improved device performance and reduced drain impact ionization. Although asymmetric FET devices provide an improvement over conventional FETs, the scaling of prior art asymmetric FET devices is also restricted since lithography is also used to define the length of the gate.

Accordingly, there exists a need in the art for semiconductor devices, such as asymmetric FETs, that have a reduced scale and improved device performance. In addition, a need exists for fabrication techniques for making those semiconductor devices.

SUMMARY OF THE INVENTION

According to one aspect of the present invention, a semiconductor structure is provided that includes an asymmetric gate stack located on a surface of a high k gate dielectric. The term "high k gate dielectric" is used throughout the instant application to denote a dielectric material whose dielectric constant is greater than silicon oxide. The asymmetric gate stack includes a first portion laterally adjoining a second portion, wherein the first portion has a different threshold voltage than the second portion. It is observed that the term "asymmetric gate stack" refers to a gate stack having a first portion that laterally abuts a second portion, wherein the threshold voltage is different in the first and second portions. The first and second portions of the asymmetric gate stacks can be non-mirror images, or mirror images of each other; asymmetry is in terms of threshold voltage in the present application.

In one embodiment of the invention, the first portion of the inventive asymmetric gate stack has a lower threshold voltage than the second portion due to a threshold voltage adjusting material which is present in the first portion, but not the second portion of the asymmetric gate. Specifically, the first portion of the inventive asymmetric gate stack includes, from bottom to top, a threshold voltage adjusting material and at least a first conductive spacer, while the second portion of the inventive asymmetric gate stack includes a second conductive spacer located over the gate dielectric. It is observed that the first and second conductive spacers, which are in direct contact with each other, collectively form the gate electrode of the inventive structure. It is noted that in the invention, the first conductive spacer and the second conductive spacer are present atop a common high k gate dielectric.

In another embodiment, different threshold voltages are achieved in the first and second portions of the asymmetric gate stack by providing different conductive materials for the first and second conductive spacers. In this embodiment, the first conductive spacer and the second conductive spacer are located on a surface of a common threshold voltage adjusting material.

The asymmetric gate stacks described above may be an nFET gate stack or a pFET gate stack.

In other aspect of the present invention a complementary metal oxide semiconductor (CMOS) structure is provided that includes at least one nFET and at least one pFET located on a surface of a semiconductor substrate that includes an nFET device area and a pFET device area. Within the nFET device area there is present at least one nFET asymmetric gate stack which is located on a high k gate dielectric. The nFET asymmetric gate stack includes a first nFET portion laterally adjoining a second nFET portion, wherein the first nFET portion has a different threshold voltage than the second nFET portion. The first nFET portion of the nFET asymmetric gate stack includes, from bottom to top, an nFET threshold voltage adjusting material and at least a first conductive spacer, while the second nFET portion of the nFET asymmetric gate stack includes at least a second conductive spacer located above the gate dielectric. In some embodiments, the second portion of the nFET asymmetric gate stack does not include the threshold voltage adjusting material, while in others (when the first and second conductive spacers are composed of different conductive materials) the second portion of the nFET asymmetric gate stack also includes the threshold voltage adjusting material. Also within the inventive CMOS, a pFET asymmetric gate stack is located on a high k gate dielectric within the nFET device area. Typically, but not necessarily always, a common high k gate dielectric is present in the different device regions. The pFET asymmetric gate stack includes a first pFET portion laterally adjoining a second pFET portion, wherein the first pFET portion has a different threshold voltage than the second pFET portion. The first pFET portion of the asymmetric pFET gate stack includes, from bottom to top, a pFET threshold voltage adjusting material and at least a first conductive spacer, while the second pFET portion of the pFET asymmetric gate stack includes at least a second conductive spacer located over the gate dielectric. In some embodiments, the second portion of the pFET asymmetric gate stack does not include the threshold voltage adjusting material, while in others (when the first and second conductive spacers are composed of different conductive materials) the second portion of the pFET asymmetric gate stack also includes the threshold voltage adjusting material.

A further aspect of the present invention relates to a method of fabricating the aforementioned semiconductor structures.

The method of the present invention uses a spacer scheme, which is free from lithographic masks. As such, the inventive spacer scheme allows for the fabrication of gates that are smaller than the smallest dimension that is obtainable using conventional lithography. Also, the inventive spacer scheme allows for the production of an asymmetric gate stack that has a variable workfunction within the same gate stack.

The method of the present invention includes first forming at least one patterned sacrificial material on a material stack including, from bottom to top, a high k gate dielectric and a threshold voltage adjusting material. Next, at least a first conductive spacer is formed on exposed sidewalls of the at least one patterned sacrificial material, wherein a base of the first conductive spacer is located on a surface of the threshold voltage adjusting material. In some embodiments of the invention, a second conductive spacer can be formed after forming the first conductive spacer. When such an embodiment is performed, the first and second conductive spacers are composed of a different conductive material. Exposed portions of the threshold voltage adjusting material not protected by the at least first conductive spacer and the at least one patterned sacrificial material are then removed to expose a surface of the high k gate dielectric. If not previously formed, a second conductive spacer is formed laterally adjoining the first conductive spacer, wherein a base of the second conductive spacer is located on a portion of the exposed surface of the high k gate dielectric. The at least one patterned sacrificial material, portions of the threshold voltage adjusting material, and portions of the high k gate dielectric not protected by the first conductive spacer and the second conductive spacer are then removed. Following this step, various implantation steps and dielectric spacer formation are performed to form a semiconductor structure including the inventive asymmetric FET.

DETAILED DESCRIPTION OF THE INVENTION

The present invention, which provides asymmetric semiconductor devices and a method of fabricating the same, will now be described in greater detail by referring to the following discussion and drawings that accompany the present application. It is noted that the drawings of the present application are provided for illustrative purposes only and, as such, the drawings are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Reference is now made to FIGS. 1-9 which are pictorial representations (through cross sectional view) illustrating the asymmetric semiconductor device during various stages of fabrication in accordance with an embodiment of the present invention. The method of the present invention in this embodiment begins by first providing the initial structure 10 shown in FIG. 1. The initial structure 10 shown in FIG. 1 includes a semiconductor substrate 12, a high k gate dielectric 14 located atop the semiconductor substrate 12 and a threshold voltage adjusting material 16 located on a surface of the high k gate dielectric 14.

Figure 1:
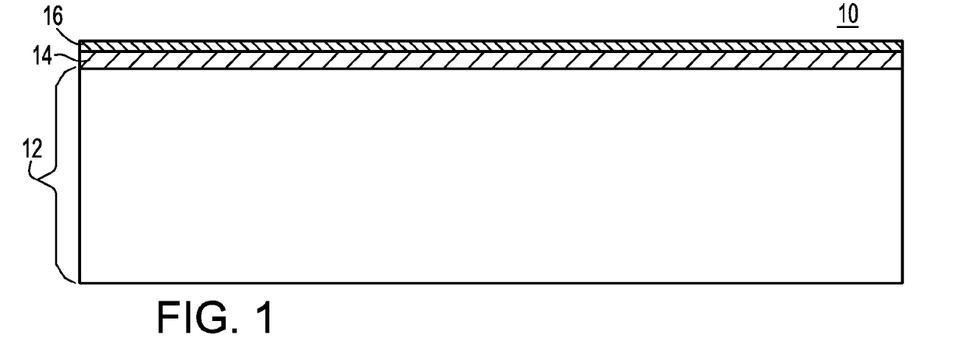
FIG. 1 is a pictorial representation (through a cross sectional view) illustrating an initial structure including, for bottom to top, a semiconductor substrate, a high k gate dielectric and a threshold voltage adjusting material that can be employed in the present invention.

The semiconductor substrate 12 illustrated in FIG. 1 is comprised of any semiconductor material including, but not limited to Si, Ge, SiGe, SiC, SiGeC, GaAs, GaN, InAs, InP and all other III/V or II/VI compound semiconductors. Semiconductor substrate 12 may also comprise an organic semiconductor or a layered semiconductor such as Si/SiGe, a silicon-on-insulator (SOI), a SiGe-on-insulator (SGOI) or a germanium-on-insulator (GOI). In some embodiments of the present invention, it is preferred that the semiconductor substrate 12 is composed of a Si-containing semiconductor material, i.e., a semiconductor material that includes silicon. The semiconductor substrate 12 may be doped, undoped or contain doped and undoped regions therein. The semiconductor substrate 12 may include a single crystal orientation or it may include at least two coplanar surface regions that have different crystal orientations (the latter substrate is referred to in the art as a hybrid substrate). When a hybrid substrate is employed, an nFET is typically formed on a (100) crystal surface, while a pFET is typically formed on a (110) crystal plane. The hybrid substrate can be formed by techniques that are well known in the art. See, for example, U.S. Pat. No. 7,329,923, U.S. Publication No. 20050116290, dated Jun. 2, 2005 and U.S. Pat. No. 7,023,055, the entire contents of each are incorporated herein by reference.

The semiconductor substrate 12 may also include a first doped (n- or p-) region, and a second doped (n- or p-) region. For clarity, the doped regions are not specifically shown in any of the drawings of the present application. The first doped region and the second doped region may be the same, or they may have different conductivities and/or doping concentrations. These doped regions are known as "wells" and they are formed utilizing conventional ion implantation processes.

At least one isolation region (not shown) is then typically formed into the semiconductor substrate 12. The isolation region may be a trench isolation region or a field oxide isolation region. The trench isolation region is formed utilizing a conventional trench isolation process well known to those skilled in the art. For example, lithography, etching and filling of the trench with a trench dielectric may be used in forming the trench isolation region. Optionally, a liner may be formed in the trench prior to trench fill, a densification step may be performed after the trench fill and a planarization process may follow the trench fill as well. The field oxide may be formed utilizing a so-called local oxidation of silicon process. Note that the at least one isolation region provides isolation between neighboring gate regions, typically required when the neighboring gates have opposite conductivities, i.e., nFETs and pFETs.

After processing the semiconductor substrate 12, a chemox layer (not shown) is optionally formed on the surface of the semiconductor substrate 12. The optional chemox layer is formed utilizing a conventional growing technique that is well known to those skilled in the art including, for example, oxidation or oxynitridation. In some embodiments of the invention, the chemox layer is formed by a wet chemical oxidation process. When the substrate 12 is a Si-containing semiconductor, the chemox layer is comprised of silicon oxide, silicon oxynitride or a nitrided silicon oxide. When the substrate 12 is other than a Si-containing semiconductor, the chemox layer may comprise a semiconducting oxide, a semiconducting oxynitride or a nitrided semiconducting oxide. The thickness of the chemox layer is typically from about 0.5 nm to about 1.2 nm, with a thickness from about 0.8 nm to about 1 nm being more typical. The thickness, however, may be different after processing at higher temperatures, which are usually required during FET or CMOS fabrication.

A high k gate dielectric 14 is then formed overlying the semiconductor substrate 12. The high k gate dielectric 14 employed in the present invention includes any dielectric metal oxide having a dielectric constant that is greater than the dielectric constant of silicon oxide, e.g., 3.9. Typically, the high k gate dielectric 14 that is employed in the present invention has a dielectric constant greater than 4.0, with a dielectric constant of greater than 8.0 being even more typical. Exemplary high k dielectric materials include, but are not limited to $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Multilayered stacks of these high k materials can also be employed as the high k gate dielectric 14. Each value of x is independently from 0.5 to 3 and each value of y is independently from 0 to 2.

The thickness of the high k gate dielectric 14 may vary depending on the technique used to form the same. Typically, however, the high k gate dielectric 14 has a thickness from 0.5 nm to 10 nm, with a thickness from 1.0 nm to 5 nm being even more typical. The high k gate dielectric 14 employed in the invention may have an effective oxide thickness on the order of, or less than, 1 nm.

The high k gate dielectric 14 is formed by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), and other like deposition processes.

After forming the high k gate dielectric 14, a threshold voltage adjusting material 16 is formed on an exposed upper surface of the high k gate dielectric 14. The term "threshold voltage adjusting material" as used throughout the instant application denotes a material that moves the threshold voltage of a gate stack towards either the nFET or pFET band edge. The threshold voltage adjusting material 16 employed in the present invention may include an nFET threshold voltage adjusting material or a pFET threshold voltage adjusting material. The type of threshold voltage adjusting material employed in this step of the invention is dependent on which conductivity type device, e.g., nFET or pFET, is being fabricated.

One example of an nFET threshold voltage adjusting material that can be used in the present invention is a rare earth metal-containing material that comprises an oxide or nitride of at least one element from Group IIIB of the Periodic Table of Elements (CAS version) including, for example, La, Ce, Pr, Nd, Pm, Sm, Eu, Ga, Tb, Dy, Ho, Er, Tm, Yb, Lu or mixtures thereof. Preferably, the rare earth metal-containing material comprises an oxide of La, Ce, Y, Sm, Er and/or Tb, with $La_2O_3$ or LaN being more preferred.

The rare earth metal-containing material is formed utilizing a conventional deposition process including, for example, evaporation, molecular beam deposition, metalorgano chemical vapor deposition (MOCVD), atomic layer deposition (ALD), physical vapor deposition (PVD) and other like deposition processes. In one embodiment of the present invention, the rare earth metal-containing material is formed by placing the structure including the high-k gate dielectric into the load-lock of a molecular beam deposition chamber, followed by pumping this chamber down to the range of $10^{-5}$ Torr to $10^{-8}$ Torr. After these steps, the structure is inserted, without breaking vacuum into the growth chamber where the rare earth metal-containing material such as La oxide is deposited by directing atomic/molecular beams of the rare earth metal and oxygen or nitrogen onto the structure's surface. Specifically, because of the low pressure of the chamber, the released atomic/molecular species are beamlike and are not scattered prior to arriving at the structure. A substrate temperature of about 300° C. is used. In the case of $La_2O_3$ deposition, the La evaporation cell is held in the temperature range of 1400° C. to 1700° C., and a flow rate of 1 sccm to 3 sccm of molecular oxygen is used. Alternatively, atomic or excited oxygen may be used as well, and this can be created by passing the oxygen through a radio frequency source excited in the range of 50 Watts to 600 Watts. During the deposition, the pressure within the chamber can be in the range from $1 \times 10^{-5}$ Torr to $8 \times 10^{-5}$ Torr, and the La oxide growth rate can be in the range from 0.1 nm per minute to 2 nm per minute, with a range from 0.5 nm per minute to 1.5 nm per minute being more typical.

Another example of an nFET threshold voltage adjusting material that can be used in the present invention is an alkaline earth metal-containing material that comprises a compound having the formula $MA_x$ wherein M is an alkaline earth metal (Be, Mg, Ca, Sr, and/or Ba), A is one of O, S and a halide, and x is 1 or 2. It is noted that the present invention contemplates alkaline earth metal-containing compounds that include a mixture of alkaline earth metals and/or a mixture of anions, such as an oxychloride. Examples of alkaline earth metal-containing compounds that can be used in the present invention include, but are not limited to MgO, MgS, $MgF_2$, $MgCl_2$, $MgBr_2$, $MgI_2$, CaO, CaS, $CaF_2$, $CaCl_2$, $CaBr_2$, $CaI_2$, SrO, SrS, $SrF_2$, $SrCl_2$, $SrBr_2$, $SrI_2$, BaO, BaS, $BaF_2$, $BaCl_2$, $BaBr_2$, and $BaI_2$. In one preferred embodiment of the present invention, the alkaline earth metal-containing compound includes Mg. MgO is a highly preferred alkaline earth metal-containing material employed in the present invention.

The alkaline earth metal-containing material is formed utilizing a conventional deposition process including, for example, sputtering from a target, reactive sputtering of an alkaline earth metal under oxygen plasma conditions, electroplating, evaporation, molecular beam deposition, MOCVD, ALD, PVD and other like deposition processes.

In addition to nFET threshold voltage adjusting materials, the threshold voltage adjusting material 16 can alternatively be a pFET threshold voltage adjusting material. Examples of pFET threshold voltage adjusting materials include Al (and its compounds that are non-conductive such as, for example $Al_2O_3$), Ge (and its compounds that are non-conductive such as, for example $GeO_2$), and non-conductive compounds of Ti and Ta such as, $TiO_2$ and $Ta_2O_5$ respectively.

The nFET threshold voltage adjusting materials are formed utilizing conventional deposition processes well known to those skilled in the art including, but not limited to chemical vapor deposition (CVD), plasma enhanced chemical vapor deposition (PECVD), chemical solution deposition, atomic layer deposition (ALD), physical vapor deposition (PVD), sputtering and plating.

Notwithstanding the type of material used as the threshold voltage adjusting material 16, the threshold voltage adjusting material 16 has a thickness from 0.1 nm to 5.0 nm, with a thickness from 0.3 nm to 2.0 nm being even more typical.

Figure 2:
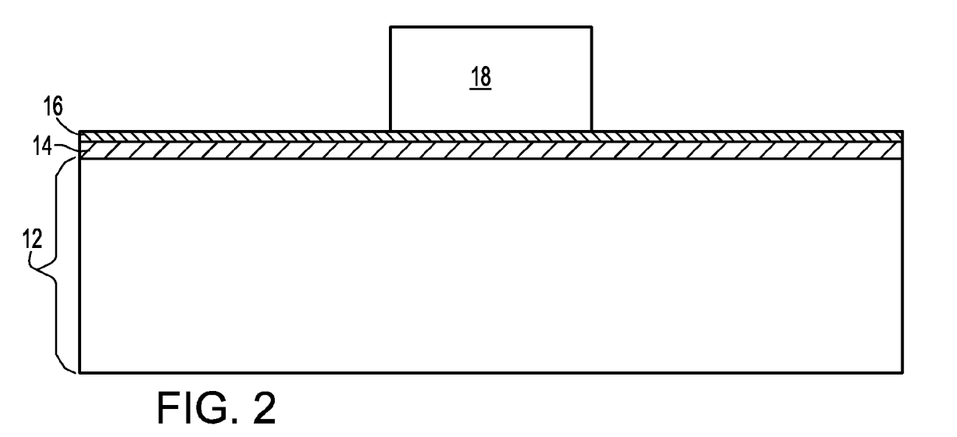
FIG. 2 is a pictorial representation (through a cross sectional view) illustrating the structure of FIG. 1 after forming a patterned sacrificial material on an upper surface of the threshold voltage adjusting material.

Next, and as shown in FIG. 2, a patterned sacrificial material 18 is formed on an upper surface of the threshold voltage adjusting material 16. The patterned sacrificial material 18 is comprised of any material that can be removed selectively in comparison with conductive spacers to be subsequently formed. In one embodiment of the present invention, the sacrificial material is comprised of silicon nitride, silicon oxynitride, silicon oxide, or a combination thereof. Preferably, silicon nitride is employed as the sacrificial material.

The patterned sacrificial material 18 is formed by deposition of a blanket layer of sacrificial material atop the threshold voltage adjusting material 16, followed by lithography and etching. The deposition of the blanket layer of sacrificial material includes any conventional deposition process including, but not limited to chemical vapor deposition (CVD), plasma enhanced chemical vapor deposition (PECVD), atomic layer deposition (ALD), evaporation, physical vapor deposition (PVD) and sputtering. The thickness of the blanket layer of sacrificial material that is formed may vary depending on the deposition technique used to form the same as well as the material of the sacrificial material. Typically, the as deposited sacrificial material has a thickness from 25 nm to 500 nm, with a thickness from 50 nm to 200 nm being even more typical. Following deposition of the blanket layer of sacrificial material a photoresist is formed on the surface of the blanket layer of sacrificial material by a conventional deposition process including, for example, CVD, PECVD, evaporation or spin-on coating. The applied photoresist is then exposed to a desired pattern of radiation, e.g., a typical gate pattern, and thereafter the exposed photoresist is developed utilizing a conventional resist developer. The pattern of the photoresist is then transferred to the underlying blanket layer of sacrificial material by utilizing one of dry etching (i.e., reactive ion etching, plasma etching, ion beam etching, or laser ablation) or wet chemical etching.

Figure 3:
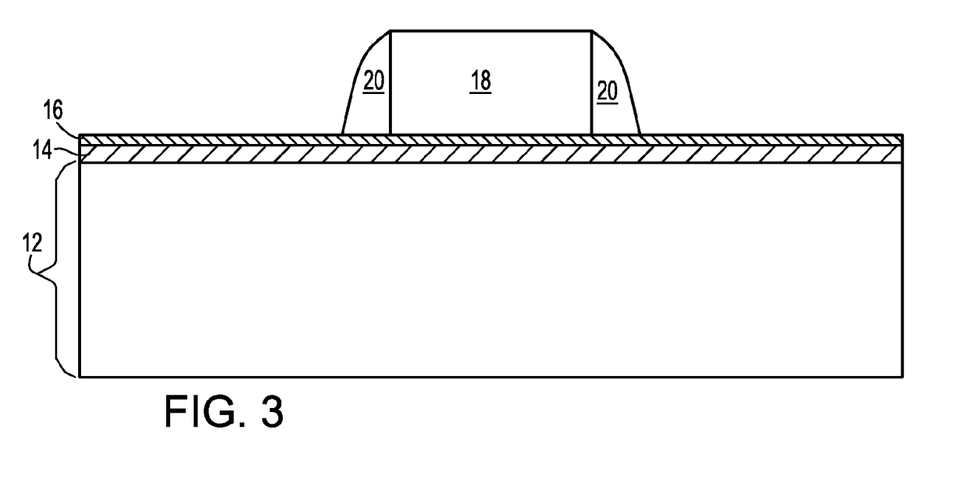
FIG. 3 is a pictorial representation (through a cross sectional view) illustrating the structure of FIG. 2 after forming a first conductive spacer on exposed sidewalls of the patterned sacrificial material.
Figure 4:
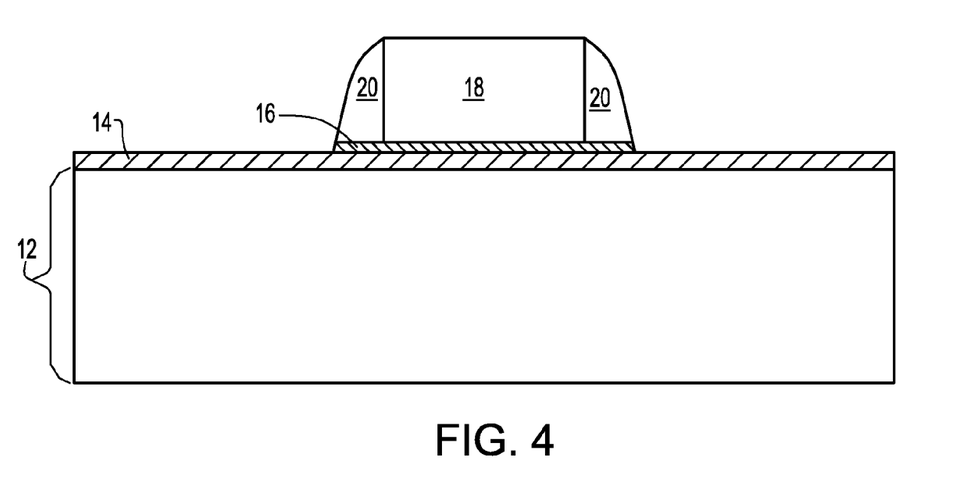
FIG. 4 is a pictorial representation (through a cross sectional view) illustrating the structure of FIG. 3 after removing the exposed portions of the threshold voltage adjusting material that are not protected by either the first conductive spacer or the patterned sacrificial material.

Next, and as shown in FIG. 3, a first conductive spacer 20 is formed on exposed sidewalls of the patterned sacrificial material 18 as well as atop an exposed surface of the threshold voltage adjusting material 16. That is, the base of the first conductive spacer 20 is located on a surface of the threshold voltage adjusting material, while a sidewall of the first conductive spacer 20 is laterally abutting the sidewalls of the patterned sacrificial material 18. It is observed that the first conductive spacer 20 forms a first gate electrode portion of the inventive asymmetric semiconductor structure. The first conductive spacer 20 is comprised of any conductive material that is typically used as a gate electrode of a FET device. Non-limiting examples of such conductive materials that can be used as the first conductive spacer 20 include polycrystalline silicon, polycrystalline silicon germanium, an elemental metal, (e.g., tungsten, titanium, tantalum, aluminum, nickel, ruthenium, palladium and platinum), an alloy of at least one elemental metal, an elemental metal nitride (e.g., tungsten nitride, aluminum nitride, and titanium nitride), an elemental metal silicide (e.g., tungsten silicide, nickel silicide, and titanium silicide) and multilayers thereof. Preferably, the first conductive spacer 20 includes at least an elemental metal. In one embodiment, titanium nitride is used as the conductive material.

The first conductive spacer 20, which forms the first gate electrode portion of the inventive asymmetric semiconductor device, is formed utilizing conventional techniques well known in the art including, for example, deposition of a conductive material, followed by anisotropic etching. The first conductive spacer 20 has a width, as measured along its base, of from 5 nm to 50 nm. In some embodiments, the conductive material can be doped prior to etching utilizing known doping process, such as ion implantation, that are well known to those skilled in the art.

At this point of the inventive method, exposed portions of at least the threshold voltage adjusting material 16 that are not protected by either the first conductive spacer 20 or the patterned sacrificial material 18 are removed utilizing an etching process that selectively removes the exposed threshold voltage adjusting material 16 as compared with the first conductive spacer, 20, patterned sacrificial material 18 and high k gate dielectric 14. An example of such a selective etching process that can be used at this step of the present invention includes HCL, etc. The resultant structure that is formed after removing the exposed portions of at least the threshold voltage adjusting material is shown, for example, in FIG. 4.

Figure 5:
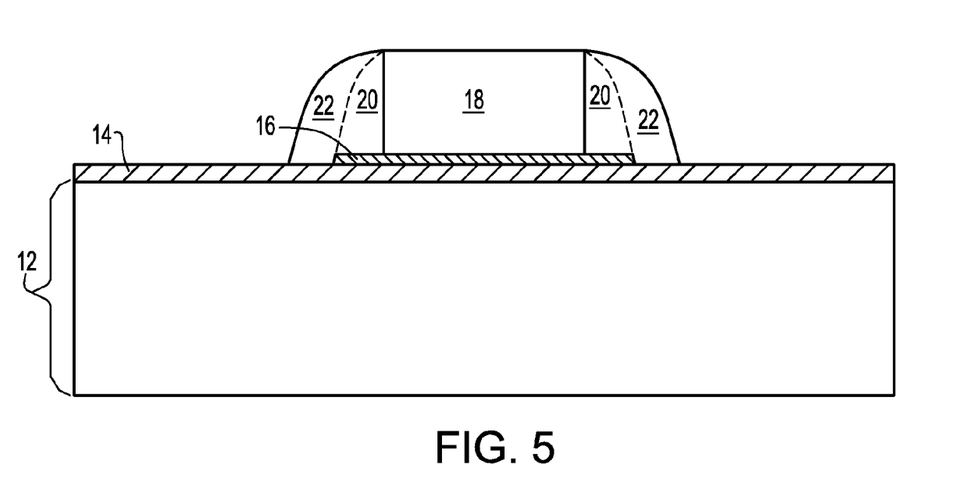
FIG. 5 is a pictorial representation (through a cross sectional view) illustrating the structure of FIG. 4 after forming a second conductive spacer on exposed portions of the high k gate dielectric as well as laterally abutting the first conductive spacer.

Next, and as shown in FIG. 5, a second conductive spacer 22 is formed adjoining the first conductive spacer 20 and on a now exposed surface of the high k gate dielectric 14. It is noted that the second conductive spacer 22 forms a second gate electrode portion of the inventive asymmetric semiconductor structure. Unlike the first conductive spacer 20, in which the base is located on a surface of the remaining threshold voltage adjusting layer 16, the base of the second conductive spacer 22 in this embodiment of the invention is present on a surface of the high k gate dielectric 14. It is further observed that for this embodiment of the invention a sidewall portion of the second conductive spacer 22, near the base, is laterally abutting a sidewall portion of the remaining threshold voltage adjusting material 16.

The second conductive spacer 22 is comprised of the same or different, preferably the same, conductive material as that of the first conductive spacer 20. Also, the second conductive spacer 22 is formed utilizing the processing steps mentioned above for the first conductive spacer 20. The second conductive spacer 22 has a width, as measured along its base, of from 5 nm to 50 nm.

After forming the second conductive spacer 22, the patterned sacrificial material 18 is removed utilizing an etch-back process that selectively removes the sacrificial material. An example of an etch-back process that can be utilized to selectively remove the patterned sacrificial material 18 is phosphorous acid.

At this point of the invention, the exposed portions of the threshold voltage adjusting material 16 (not protected by the first and second conductive spacers) and the exposed portions of the high k gate dielectric 14 (also not protected by the first and second conductive spacers) are removed by utilizing etching one or more etching steps that selectively remove those materials relative to the first and second conductive spacers 20, 22 respectively. In one embodiment, the threshold voltage adjusting material 16 beneath the now removed patterned sacrificial material 18 is first removed utilizing phosphorous acid as an etching process, and thereafter the exposed portions of the high k gate dielectric 14 are removed by HF, etc.

Figure 6:
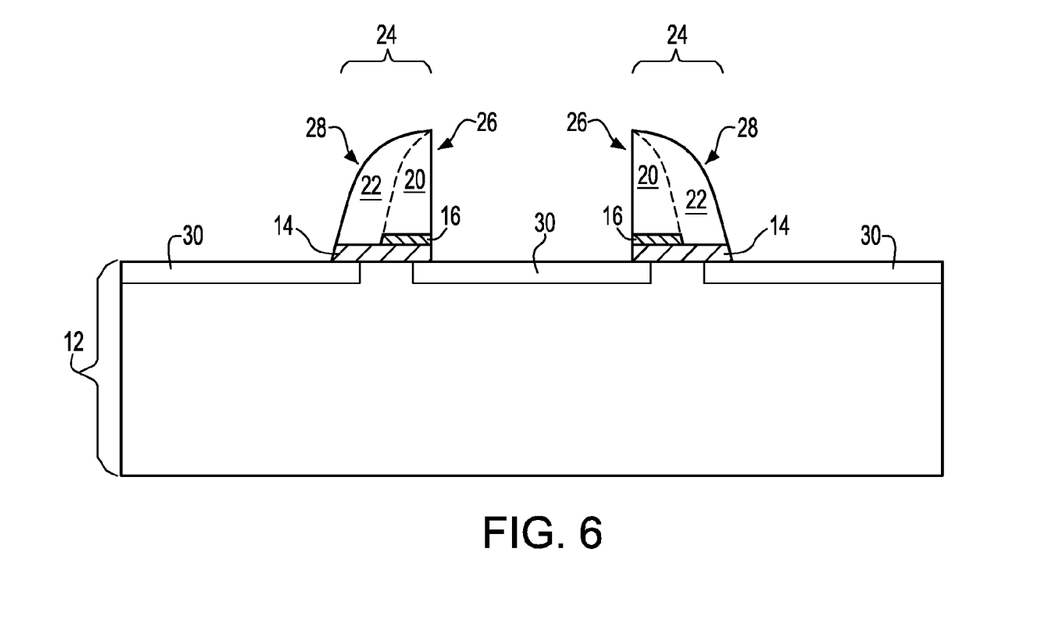
FIG. 6 is a pictorial representation (through a cross sectional view) illustrating the structure of FIG. 5 after removing the patterned sacrificial material and forming asymmetric gate stacks.

The resultant structure that is formed after selectively removing the patterned sacrificial material 18, the threshold voltage adjusting material 16 that was beneath the patterned sacrificial material 18 and the exposed portions of the high k gate dielectric 14 is shown, for example, in FIG. 6. It is observed that an asymmetric gate stack 24 is provided in which a first portion 26 thereof (including the first conductive spacer 20 and the threshold voltage adjusting material 16) has a different, e.g., lower, threshold voltage as compared with a second portion 28 of the asymmetric gate stack 24 (including the second conductive spacer 22 directly on a surface of the high k gate dielectric 14). Note that the first portion 26 of the asymmetric gate stack 24 and the second portion 28 of the asymmetric gate stack 24 are laterally abutting each other, in this embodiment, and that the two portions share a common high k gate dielectric 14. It is observed that since the asymmetric gate stacks are not formed by lithography, the dimension of the asymmetric gate stacks of the invention can be below that which is obtainable using conventional lithography. That is, the inventive asymmetric gate stacks have gate dimensions that can be sub-lithographic.

Figure 7:
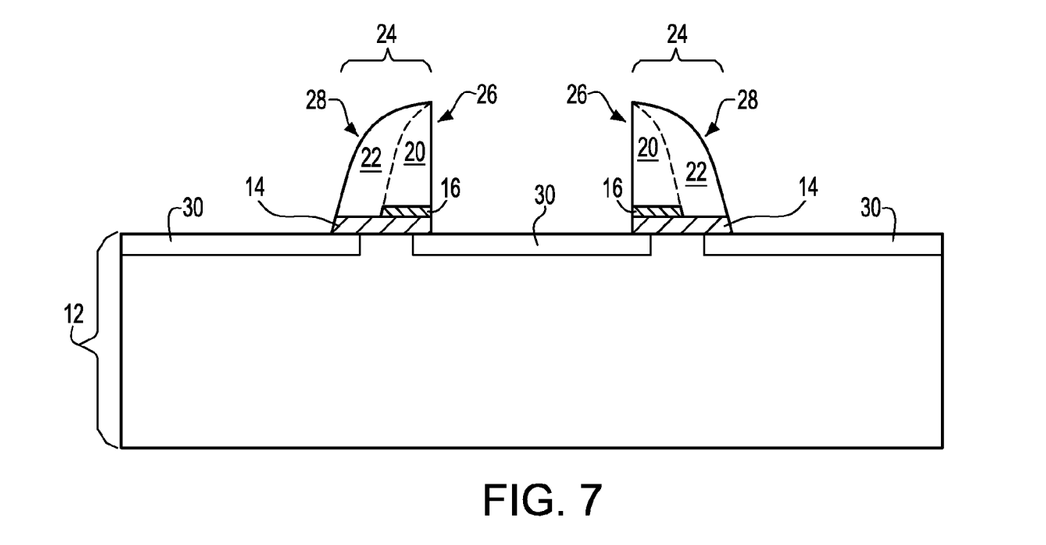
FIG. 7 is a pictorial representation (through a cross sectional view) illustrating the structure of FIG. 6 after performing a source and drain extension implant.

Next, and as shown in FIG. 7, extension regions, i.e., source and drain extensions, 30 are formed into portions of the semiconductor substrate at the foot print of the asymmetric gates by implanting extension impurities, e.g., dopants, therein. The extension impurities and conditions used for implanting the same are well known to those skilled in the art. In some embodiments, the implanted extension impurities are activated immediately after the source and drain extension implant. The activation of the extension impurities is performed utilizing a thermal anneal that is carried out at a temperature of greater than 850° C. In other embodiments, the activation is delayed until after performing a source and drain implant.

Figure 8:
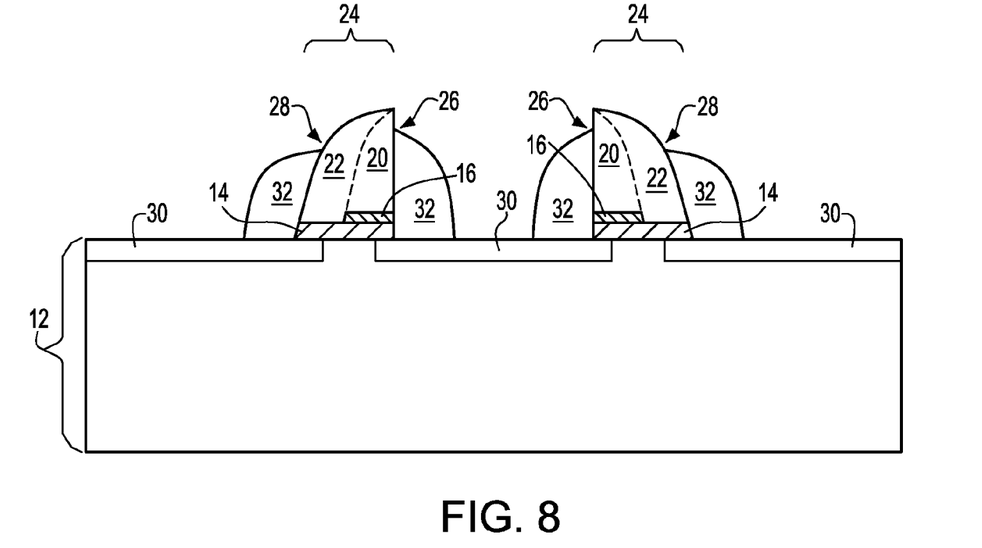
FIG. 8 is a pictorial representation (though a cross sectional view) illustrating the structure of FIG. 7 after forming a dielectric spacer adjoining the asymmetric gate stacks.

FIG. 8 shows the structure of FIG. 7 after forming a dielectric spacer 32 around each asymmetric gate stack 24. As shown, some segments of the dielectric spacer 32 adjoin, i.e., abut, the first portion 26 of the asymmetric gate stack 24, while other segments of the dielectric spacer 32 adjoin, i.e., abut, the second portion 28 of the asymmetric gate stack 24. The dielectric spacer 32 is comprised of any dielectric material, including but not limited to silicon dioxide, silicon nitride, and silicon oxynitride, with silicon nitride being a preferred dielectric spacer material in the present invention. The dielectric spacer 32 is formed by deposition, followed by anisotropic etching.

Figure 9:
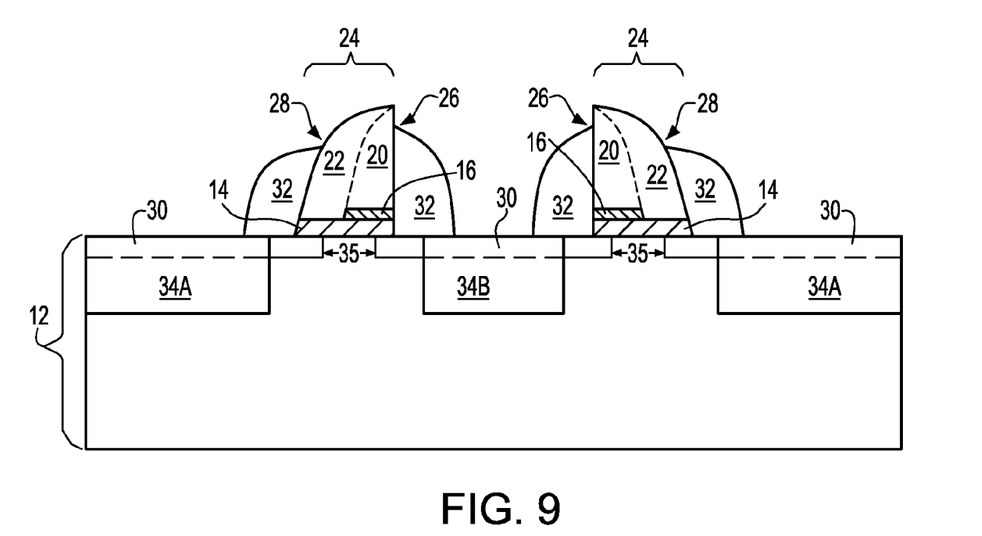
FIG. 9 is a pictorial representation (through a cross sectional view) illustrating the structure of FIG. 8 after performing a source and drain implant.

FIG. 9 shows the structure of FIG. 8 after implanting source and drain impurities, e.g., dopants, forming a source 34A and a drain 34B into the semiconductor substrate 12 utilizing the dielectric spacer 32 and the asymmetric gate stack 24 as an ion implantation mask. The ion implantation used in forming the source 34A and drain 34B includes conventional techniques and conditions well known to those skilled in the art. After ion implantation, the impurities within the semiconductor substrate 12 can be activated utilizing a thermal activation process that is performed as a temperature of greater than 850° C.

Referring to FIG. 9, there is shown the inventive structure in accordance with an embodiment of the present invention. The inventive structure illustrated in this embodiment includes a semiconductor substrate having plurality of source regions 34A and drain regions 34B located therein. A channel region 35 is interposed between each corresponding pairs of source regions 34A and drain regions 34B. Atop each channel 35 is an asymmetric gate stack 24 that is located on a common high k gate dielectric 14. Each asymmetric gate stack 24 includes a first portion 26 that laterally abuts a second portion 28, wherein the first portion 26 has a different, e.g., lower, threshold voltage than the second portion 28. The first portion 26 of each asymmetric gate stack 24 includes a threshold voltage adjusting material 16 located on a surface of gate dielectric 14, and at least a first conductive spacer 20 located on a surface of the threshold voltage adjusting material 16. The second portion 28 of the each asymmetric gate stack 24 includes a second conductive spacer 22 located on the gate dielectric 14. In the invention, the first conductive spacer 20 directly contacts the second conductive spacer 22. It is emphasized that the conductive spacers of the present invention collectively form a gate electrode of the inventive structure.

Figure 10:
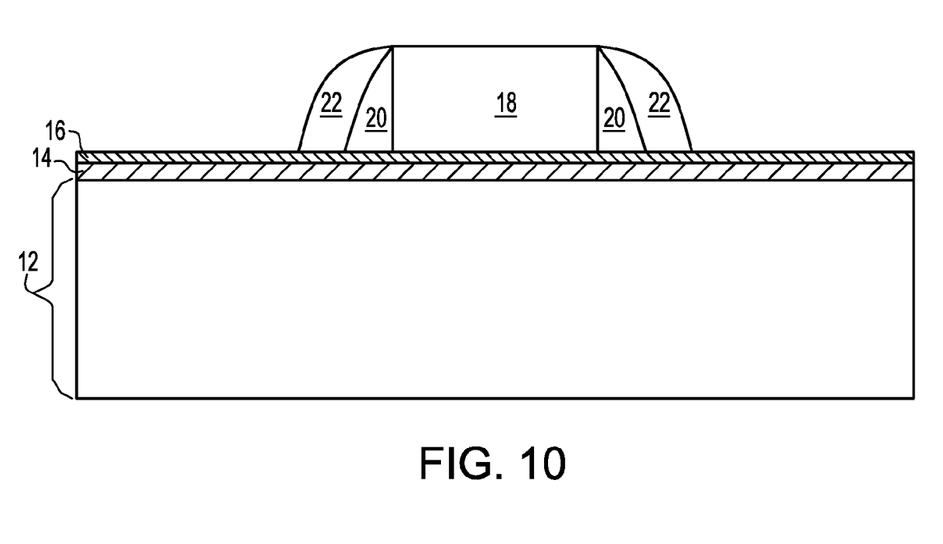
FIG. 10 is a pictorial representation (through a cross sectional view) illustrating an alternative embodiment of the invention in which a first conductive spacer and a second conductive spacer of a different composition than the first conductive spacer are applied to the structure shown in FIG. 2.

It is noted that FIGS. 1-9 illustrate one embodiment of forming an asymmetric gate stack. In another embodiment of the invention, and as shown in FIG. 10, the second conductive spacer 22 is formed laterally abutting the first conductive spacer 20 prior to removing the threshold voltage adjusting material 16. That is, this embodiment of the invention begins by first providing the structure shown in FIG. 3. After forming the first conductive spacer 20, the second conductive spacer 22 is formed and thereafter the basic processing steps described in FIGS. 6-9 are employed. In this embodiment, second conductive spacer 22 is comprised of a different conductive material than the first conductive spacer 20. Second conductive spacer 22 can be formed utilizing the same processing steps as the first conductive spacer 20. In such an embodiment, conductive spacers 20 and 22 will both be present atop the threshold voltage adjusting material 16 in the final structure. It is noted that the different threshold voltage is achieved in this embodiment by having the first and second conductive spacers be composed of different conductive materials. In the final structure, both portions of the inventive asymmetric gate stack are located over a common threshold voltage material, which is located, in turn, over a common gate dielectric.

It is observed that the processes described above with respect to FIGS. 1-9 and 10 represents embodiments of the present invention in which asymmetric nFETs or asymmetric pFETs are formed on the surface of a semiconductor substrate. In addition to the above, the methods of the present invention can also be used in forming a plurality of asymmetric nFETs in one predetermined region of the semiconductor substrate and a plurality of asymmetric pFETs in another predetermined region of the substrate.

When such a structure, i.e., a CMOS, is desired, a first block mask can be formed on a surface of the high k gate dielectric within a first device area of the substrate, and thereafter a first threshold voltage adjusting material, which is either an nFET threshold voltage adjusting material or a pFET threshold adjusting material, is formed on the entire structure. The first threshold voltage adjusting material atop the block mask and the first block itself are then removed to form a structure including the first (nFET or pFET) threshold voltage adjusting material within the first device area of the substrate. A second block mask can now be formed within the first device area of the substrate including the first threshold voltage material, and thereafter a second threshold voltage adjusting material which is opposite to the first threshold voltage adjusting material is formed. For example, when the first threshold voltage adjusting material is a pFET threshold adjusting material, then the second threshold voltage adjusting material is an nFET threshold voltage material. Alternatively, when the first threshold voltage adjusting material is an nFET threshold adjusting material, then the second threshold voltage adjusting material is a pFET threshold voltage material. The second threshold voltage adjusting material atop the second block mask is then removed from within the first device area of the substrate providing an initial structure including a first threshold voltage adjusting material within the first device area of the substrate, a second threshold voltage material within the second device area of the substrate. Such an initial structure can be used in place of the initial structure 10 shown in FIG. 1 and thereafter the processing steps mentioned in FIGS. 2-9 or FIG. 10 can be performed. In some instances, it may be necessary to use block masks during the processing steps to ensure proper fabrication of a desired conductivity type FET.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A semiconductor structure comprising:
an asymmetric gate stack located on a surface of high k gate dielectric, said asymmetric gate stack including a first portion laterally adjoining a second portion, wherein said first portion has a different threshold voltage than the second portion, and said first portion includes, from bottom to top, a threshold voltage adjusting material and at least a first conductive spacer, and said second portion includes at least a second conductive spacer located over the gate dielectric.

2. The semiconductor structure of claim 1 wherein said first conductive spacer and said second conductive spacer are composed of different conductive materials, and said second conductive spacer is located on a surface of the threshold voltage adjusting material that is positioned between the gate dielectric and the second conductive spacer.

3. The semiconductor structure of claim 1 wherein said threshold voltage adjusting material is an nFET threshold voltage adjusting material.

4. The semiconductor structure of claim 3 wherein said nFET threshold voltage adjusting material is a rare earth metal-containing material that comprises an oxide or nitride of at least one element from Group IIIB of the Periodic Table of Elements.

5. The semiconductor structure of claim 4 wherein said Group IIIB element is one of La, Ce, Y, Sm, Er and Tb.

6. The semiconductor structure of claim 4 wherein said rare earth metal-containing material is $La_2O_3$ or LaN.

7. The semiconductor structure of claim 3 wherein said nFET threshold voltage adjusting material is an alkaline earth metal containing material that comprises a compound of the formula $MA_x$ wherein M is an alkaline earth metal, A is one of O, S and a halide, and x is 1 or 2.

8. The semiconductor structure of claim 7 wherein said alkaline earth metal-containing material is MgO.

9. The semiconductor structure of claim 1 wherein said threshold voltage adjusting material is a pFET threshold voltage adjusting material.

10. The semiconductor structure of claim 9 wherein said pFET threshold voltage adjusting material includes Al, $Al_2O_3$, Ge, $GeO_2$, non-conductive compounds of Ti, or non-conductive compounds of Ta.

11. The semiconductor structure of claim 1 wherein said high k gate dielectric is a dielectric metal oxide having a dielectric constant of greater than 4.0.

12. The semiconductor structure of claim 1 wherein said first and second conductive spacers are comprised of the same or different conductive material selected from polycrystalline silicon, polycrystalline silicon germanium, an elemental metal, an alloy of at least one elemental metal, an elemental metal nitride, an elemental metal silicide and multilayers thereof.

13. A semiconductor structure comprising:
a semiconductor substrate having an nFET device area and a pFET device area,
an nFET asymmetric gate stack located on a high k gate dielectric within said nFET device area, said nFET asymmetric gate stack including a first nFET portion laterally adjoining a second nFET portion, wherein said first nFET portion has a different threshold voltage than the second nFET portion, and said first nFET portion includes, from bottom to top, an nFET threshold voltage adjusting material and at least a first conductive spacer, and said second nFET portion includes at least a second conductive spacer located over the gate dielectric; and
a pFET asymmetric gate stack located on the high k gate dielectric within said pFET device area, said pFET asymmetric gate stack including a first pFET portion laterally adjoining a second pFET portion, wherein said first pFET portion has a different threshold voltage than the second pFET portion, and said first pFET portion includes, from bottom to top, a pFET threshold voltage adjusting material and at least a first conductive spacer, and said second pFET portion includes at least a second conductive spacer located over the gate dielectric.

14. The semiconductor structure of claim 13 wherein said nFET threshold voltage adjusting material is a rare earth metal-containing material that comprises an oxide or nitride of at least one element from Group IIIB of the Periodic Table of Elements.

15. The semiconductor structure of claim 14 wherein said Group IIIB element is one of La, Ce, Y, Sm, Er and Tb.

16. The semiconductor structure of claim 14 wherein said rare earth metal-containing material is $La_2O_3$ or LaN.

17. The semiconductor structure of claim 13 wherein said nFET threshold voltage adjusting material is an alkaline earth metal containing material that comprises a compound of the formula $MA_x$ wherein M is an alkaline earth metal, A is one of O, S and a halide, and x is 1 or 2.

18. The semiconductor structure of claim 13 wherein said pFET threshold voltage adjusting material includes Al, $Al_2O_3$, Ge, $GeO_2$, non-conductive compounds of Ti, or non-conductive compounds of Ta.

* * * * *